United States Patent [19]

Botez et al.

[11] Patent Number: 5,038,356

[45] Date of Patent: Aug. 6, 1991

[54] VERTICAL-CAVITY SURFACE-EMITTING DIODE LASER

[75] Inventors: Dan Botez, Redondo Beach; Luke J. Mawst, Torrance; Thomas J. Roth; Lawrence M. Zinkiewicz, both of Redondo Beach, all of Calif.

[73] Assignee: TRW Inc., Redondo Beach, Calif.

[21] Appl. No.: 445,223

[22] Filed: Dec. 4, 1989

[51] Int. Cl.$^5$ .................................................. H01S 3/19
[52] U.S. Cl. ...................................... 372/45; 372/46; 372/48; 372/49; 357/4; 357/17; 437/129
[58] Field of Search .................................... 372/43–45, 372/48, 49; 357/4, 17; 437/129; 156/609, 655

[56] References Cited

U.S. PATENT DOCUMENTS

| | | | |
|---|---|---|---|
| 3,703,670 | 11/1972 | Kunz | 317/235 R |
| 3,983,509 | 9/1976 | Scifres et al. | 331/94.5 H |
| 4,053,914 | 10/1977 | Goodwin | 357/17 |
| 4,309,670 | 1/1982 | Burnham et al. | 331/94.5 H |
| 4,342,944 | 8/1982 | SpringThorpe | 313/499 |
| 4,581,744 | 4/1986 | Takamiyaa et al. | 372/92 |
| 4,599,729 | 7/1986 | Sasaki et al. | 372/49 |
| 4,636,821 | 1/1987 | Yanase et al. | 357/17 |
| 4,648,940 | 3/1987 | Menigaux et al. | 156/649 |
| 4,660,207 | 4/1987 | Svilans | 372/45 |
| 4,660,208 | 4/1987 | Johnston, Jr. et al. | 372/46 |
| 4,661,960 | 4/1987 | Hirayama et al. | 372/45 |
| 4,667,332 | 5/1987 | Mihashi et al. | 372/45 |
| 4,675,875 | 6/1987 | Takamiya | 372/45 |
| 4,675,876 | 6/1987 | Svilans | 372/96 |
| 4,675,877 | 6/1987 | Svilans | 372/96 |
| 4,706,101 | 11/1987 | Nakamura et al. | 357/17 |
| 4,734,385 | 3/1988 | Mihashi et al. | 437/129 |
| 4,750,183 | 6/1988 | Takahashi et al. | 372/45 |
| 4,761,790 | 8/1988 | Hayakawa et al. | 372/45 |
| 4,797,890 | 1/1989 | Inaba et al. | 372/46 |

FOREIGN PATENT DOCUMENTS 0269594 11/1988 Japan .................................... 372/45
0001290 1/1989 Japan .................................... 372/43

OTHER PUBLICATIONS

L. M. Zinkeiwicz et al., "High-Power Vertical-Cavity Surface-Emitting AlGaAs/GaAs Diode Lasers", Appl. Phys. Lett. 54 (20), pp. 1959–1961, 15 May 1989.
T. Sakaguchi et al., "Vertical Cavity Surface-Emitting Laser with an AlGaAs/AlAs Bragg Reflector", Electr. Lett., vol. 24, No. 15, pp. 928–929, 21st Jul. 1988.

Primary Examiner—Georgia Epps
Attorney, Agent, or Firm—Noel F. Heal; Sol L. Goldstein

[57] ABSTRACT

A semiconductor diode laser device, and a related method for its fabrication, the laser being of the type from which light is emitted in a direction perpendicular to planar layers forming the device. The laser includes an active layer and cladding layers formed on a supporting substrate, and a highly reflective semiconductor stack reflector formed on one of the cladding layers. The semiconductor stack reflector may be placed in contact with a heat sink and performs the multiple functions of electrical current conduction, heat removal and light reflection. A current confinement layer is formed laterally surrounding the semiconductor stack reflector, to provide one element of a back-biased junction that confines the current to the reflector region. A dielectric stack reflector is formed in a well in the substrate, and provides for light emission from the device. Operation of the device at high powers and efficiencies, even in continous-wave (CW) mode, is made possible by positioning the active layer in close proximity to the heat sink, and by the effectiveness of the current confinement layer surrounding the semiconductor stack reflector.

11 Claims, 2 Drawing Sheets

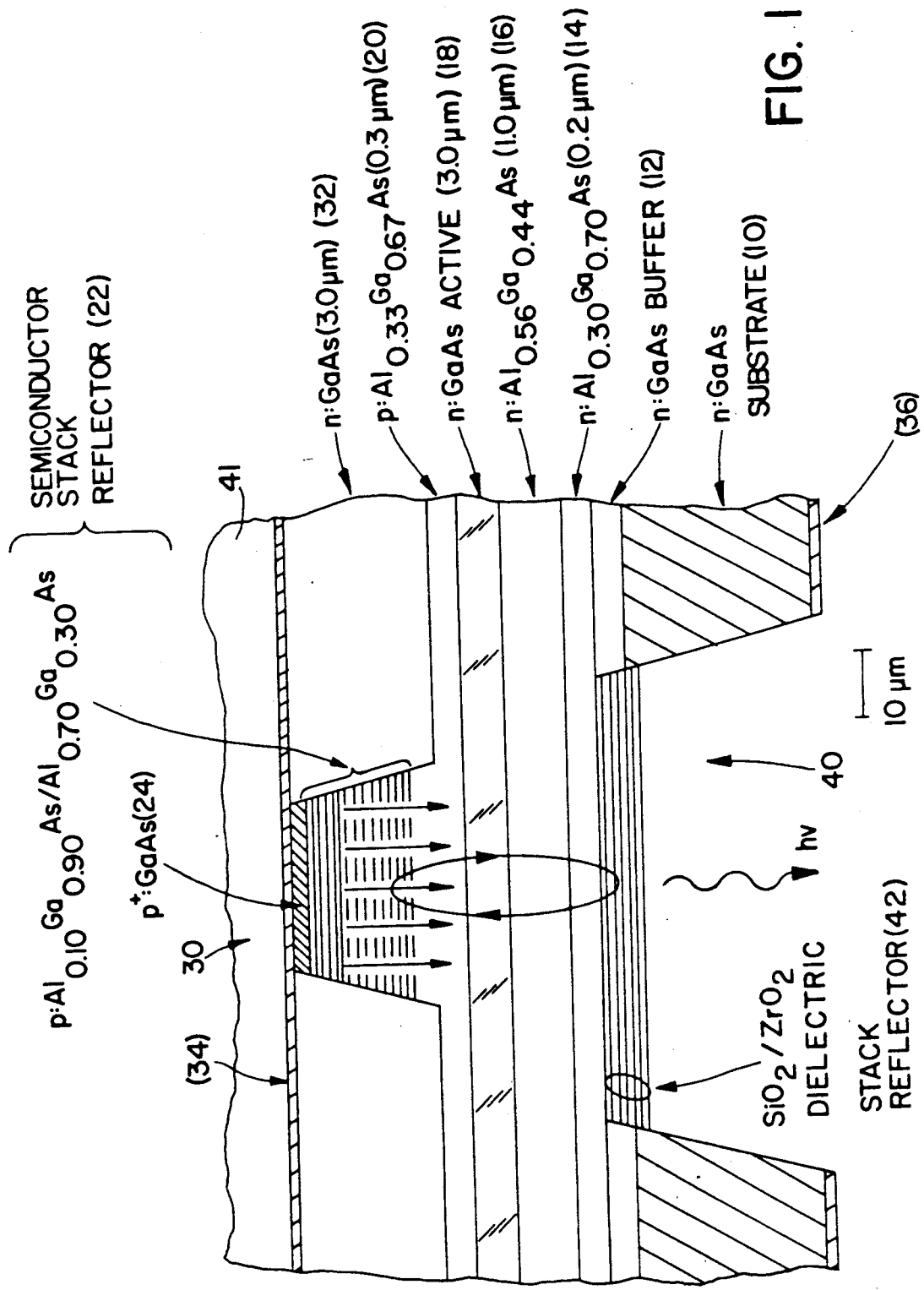

VERTICAL-CAVITY SURFACE-EMITTING DIODE LASER

BACKGROUND OF THE INVENTION

This invention relates generally to semiconductor diodes and lasers and, more particularly, to semiconductor lasers of the vertical-cavity surface-emitting type. Most semiconductor diode lasers are designed to emit light from an edge of a layered structure, in a direction parallel to the plane of an active layer in the device. In such a device, light is confined substantially within the active layer, and a Fabry-Perot cavity is formed between a pair of cleaved facets at end faces of the structure. However, for some applications of semiconductor lasers it would be desirable to have the light emitted in a direction perpendicular to the planar layers of the device. This avoids the need for a separate processing step to form cleaved facets, and reflectors can instead be formed as part of an epitaxial fabrication process. Circuit chips containing surface-emitting devices and formed on a larger semiconductor wafer, can be probe tested without having to break the chips from the wafer. Also, surface emitting structures facilitate coupling of the emitted light to optical fibers and other components.

Previous attempts to construct surface-emitting diode lasers have not been successful in achieving relatively high powers. Some previously described surface emitting structures have used a dielectrically defined metallic contact mirror configuration located behind the light source in the active layer, and a high-reflectivity dielectric-stack or semiconductor-stack reflector located in front of the source. The resultant external differential quantum efficiencies of these devices have been limited to approximately the 3–5% range, and output powers have been thermally limited to approximately 10 milliwatts (mW).

A surface-emitting diode laser structure is disclosed in U.S. Pat. No. 4,309,670 issued to Burnham et al. In that structure, current and carrier confinement to the vertical cavity is enhanced by a confinement region of different semiconductor materials, laterally surrounding an active region of the device. In other words, the active region of the device is buried both transversely, by surrounding planar layers, and laterally, by other semiconductor materials in the confinement region. One of the disclosed embodiments of Burnham et al. has a distributed Bragg reflector as one of the end mirrors of the vertical cavity. One significant drawback to the structures disclosed by Burnham et al. is that the active region cannot be located near a heat sink, and sustained operation in continuous-wave (CW) mode is therefore impossible. CW operation is important because the vast majority of applications of diode lasers of the same general type as the invention are required to operate in a highspeed modulation mode that is practically equivalent to CW operation.

It will be appreciated from the foregoing that there is still a significant need for improvement in the field of vertical-cavity surface-emitting diode lasers. In particular, there is a need for a surfaceemitting laser diode that can operate at much higher powers and quantum efficiencies than were previously attainable. The present invention satisfies this need.

SUMMARY OF THE INVENTION

The present invention resides in a vertical-cavity surface emitting diode laser structure in which high power and quantum efficiency are attainable, largely as a result of locating a high-reflectivity mirror behind an active layer of the structure, such that the active layer is in close proximity to a heat sink, and the structure may be operated at high powers, even in CW mode, to produce a relatively high power output beam at a relatively high quantum efficiency. The exceptional performance of the structure also results in part from the inclusion of a current confinement layer laterally surrounding the high-reflectivity mirror.

Briefly, and in general terms, the device of the invention comprises a semiconductor supporting structure, including a substrate, a combination of generally planar semiconductor layers formed on the semiconductor supporting structure and including an active layer in which lasing takes place, and a pair of cladding layers surrounding the active layer. The device also includes a first stack reflector formed on the combination of active and cladding layers and providing a highly reflective first mirror for a vertical cavity within the laser, a second stack reflector formed in a well recessed into the substrate, and having a reflectivity less than that of the first stack reflector, to provide a second mirror through which light is emitted from the laser, and a pair of electrical contact layers, one on the first stack reflector and the other on the substrate, to inject current into the laser cavity.

An important aspect of the invention is that the diode laser is mountable on a heat sink with the active layer positioned between the semiconductor supporting structure and the heat sink. This may be referred to as a junction-down configuration, as opposed to a junction-up configuration, in which the active layer is separated from the heat sink by the semiconductor supporting structure, which acts as a heat insulator and precludes operation in continuous-wave (CW) mode.

More specifically, the first stack reflector has a relatively small area, defining a relatively narrow cross-sectional area for the vertical cavity, and the laser further comprises a current confinement layer laterally surrounding the first stack reflector and extending into one of the cladding layers. In the disclosed embodiment of the invention, the first stack reflector is a semiconductor stack reflector, and the second stack reflector is a dielectric stack reflector.

Although the invention is not limited to particular materials or doping polarities, in the embodiment shown the active layer is of gallium arsenide, the cladding layers are of aluminum gallium arsenide, and the substrate is of gallium arsenide. The semiconductor stack reflector has alternating layers of magnesium-doped aluminum gallium arsenide p:$Al_xGa_{1-x}As$ of different thicknesses and different proportions of aluminum defined by the factor x. Specifically, there are twenty-five pairs of layers in the semiconductor stack reflector. The layers of each pair have x values of 0.1 and 0.7, and thicknesses of approximately 620Å and 700Å, respectively.

In the diode laser as disclosed by way of example, the combination of semiconductor layers further includes a buffer layer adjacent to the substrate, and an etch stop layer formed between the buffer layer and the active and cladding layers, wherein the etch stop layer facilitates formation of the second stack reflector.

In terms of a method of fabrication, the invention includes the steps of forming a semiconductor supporting structure, including a substrate, forming a combination of generally planar semiconductor layers on the semiconductor supporting structure, including an active layer in which lasing takes place, and a pair of cladding layers surrounding the active layer, and forming a first stack reflector on the combination of active and cladding layers, to provide a highly reflective first mirror for a vertical cavity within the laser. Subsequent steps include forming a second stack reflector in a well recessed into the substrate, the second stack reflector having a reflectivity less than that of the first stack reflector, to provide a second mirror for the vertical cavity of the laser, through which light is emitted, and forming a pair of electrical contact layers, one on the first stack reflector and the other on the substrate, to inject current into the laser cavity. An important later step is mounting the diode laser on a heat sink, with the active layer positioned between the semiconductor supporting structure and the heat sink.

After the step of forming the first stack reflector, the method also includes the additional steps of removing the first stack reflector layers except in a mesa region defining the reflector, and growing a current confinement layer in a region laterally surrounding the mesa region, to form a back-biased junction with one of the cladding layers, thereby confining current substantially to the mesa region.

To facilitate formation of the second stack reflector, the method may also include the steps of forming a buffer layer on the substrate prior to the formation of the cladding and active layers, forming an etch stop layer on the buffer layer, and, before forming the second stack reflector, etching a well in the substrate. The etch stop layer facilitates formation of a flat-bottom well without damage to the cladding or active layers.

It will be appreciated from the foregoing that the present invention represents a significant advance in the field of diode lasers of the vertical-cavity, surface-emitting type. In particular, the invention provides a structure having output powers approximately ten times those that were previously available from lasers of this type, at high levels of quantum efficiency. Other aspects and advantages of the invention will become apparent from the following more detailed description, taken in conjunction with the accompanying drawings.

BRIEF DESCRIPTION OF THE DRAWINGS

FIG. 1 is a cross-sectional schematic view of a vertical-cavity surface-emitting diode laser in accordance with the invention;

DESCRIPTION OF THE PREFERRED EMBODIMENT

Figure 3:
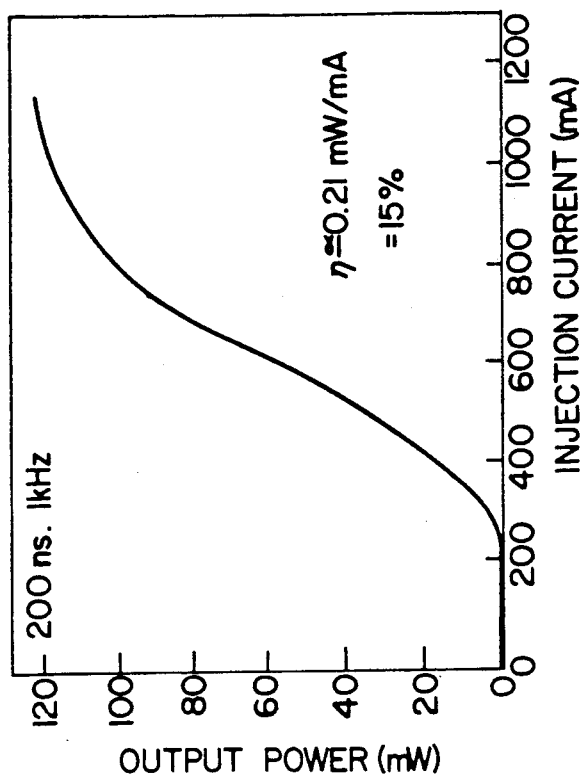
FIG. 3 is a graph showing the output power of the device of FIG. 1, as it varies with injection current.

As shown in the drawings, the present invention is concerned with vertical-cavity surface-emitting (VCSE) diode laser structures. VCSE lasers are a class of devices with a wide range of potential uses, from parallel optical processing and integrated optical circuit interconnects, to two-dimensional externally locked diode laser arrays. In VCSE devices the lasing cavity is perpendicular to the surface of a semiconductor chip on which the laser is formed, allowing for relatively high packing density compared to edge-emitting diode lasers. Also, the circular nature of their output beams makes VCSE lasers ideally suited for use in beam combining techniques for high-power applications. VCSE lasers prior to this invention have been limited in power and quantum efficiency.

In accordance with the invention, a VCSE structure is configured to permit its light source, in an active layer, to be located in close proximity to a heat sink, thereby allowing operation in CW mode at relatively high output powers and high quantum efficiencies.

As shown in the illustrative embodiment of FIG. 1, the VCSE diode laser structure of the invention is a layered structure from which light is emitted perpendicularly with respect to the planes of the layers. The structure is best described by the steps performed in making it.

Fabrication of the structure follows a twostep metal-organic chemical vapor deposition (MOCVD) crystal growth process. A number of lasers may be formed simultaneously on a substrate of (100) oriented silicon-doped gallium arsenide (n:GaAs), indicated by reference numeral 10. The first phase of growth includes the formation of the following six successive layers:

a buffer layer 12 of silicon-doped gallium arsenide (n:GaAs) of 0.5 $\mu$m thickness, an etch stop layer 14 of silicon-doped n type aluminum gallium arsenide (n:$Al_{0.30}Ga_{0.70}As$) of 0.2 $\mu$m thickness, an n-cladding layer 16 of silicon-doped aluminum gallium arsenide (n:$Al_{0.56}Ga_{0.44}As$) of 1.0 $\mu$m thickness, an active layer 18 of silicon-doped gallium arsenide (n:GaAs) of 3.0 $\mu$m thickness, a p-cladding layer 20 of magnesium-doped aluminum gallium arsenide (p:$Al_{0.33}Ga_{0.67}As$), and a 25-period semiconductor stack reflector (SSR) 22.

The SSR 22 consists of 25 pairs of layers of magnesium-doped aluminum gallium arsenide, each pair having one layer each of:

p:$Al_{0.10}Ga_{0.90}As$ 620Å thick, and
p:$Al_{0.70}Ga_{0.30}As$ 700Å thick.

Figure 2:
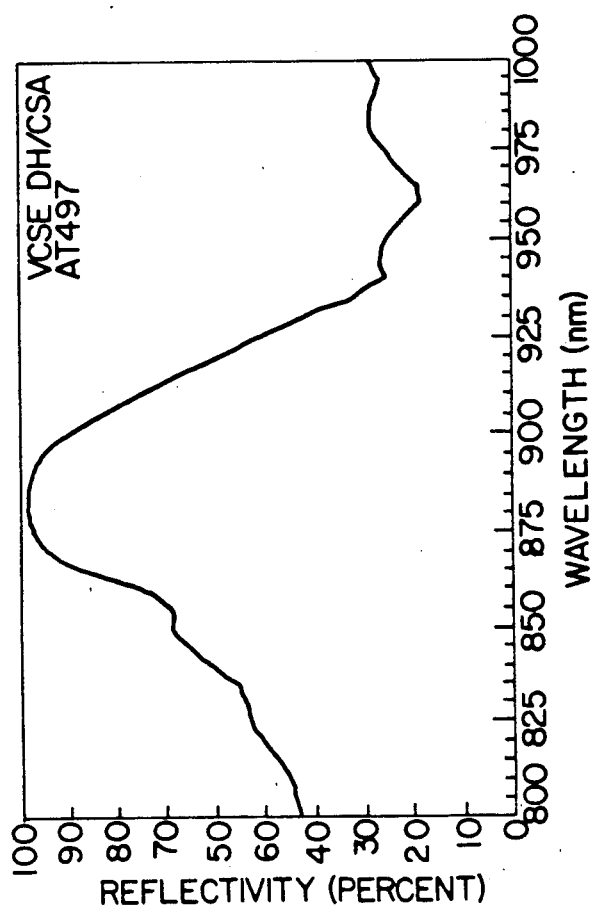
FIG. 2 is a graph showing the reflectivity of a 25-pair semiconductor-stack reflector (SSR) as it varies with wavelength.

Since a high mirror reflectivity is critical in achieving low threshold current densities in vertical cavities, the growth may be interrupted at this point to measure the reflectivity of the SSR 22. This is plotted in FIG. 2 as a function of wavelength, as measured on a Cary 2300 spectrometer. The reflectivity has a peak value of 98% at 885 nm and is over 95% between 870 and 890 nm. The final step in the first phase of growth is forming a cap layer 24 of p+ type gallium arsenide of thickness 600Å.

After the first-phase growth described above, the resulting structure is processed by conventional photo-lithographic techniques to define one or more circular mesas, of 35-$\mu$m diameter, one of which is indicated at 30. Outside of the mesas 30, the SSR 22 is etched away and the p-cladding layer 20 is etched to a thickness of 0.2 $\mu$m. A silicon oxide film (not shown) is used to cover the top of the mesa 30 while a silicon-doped current confinement layer 32 of gallium arsenide (n:GaAs) is grown on the p-cladding layer 20, to a thickness of approximately 3.0 $\mu$m. After this regrowth step, a metal contact (not shown), 15 $\mu$m in diameter, of Ti-Pt-Au, is deposited on the top of each mesa 30. A metallized layer 34 is later formed over the structure to make electrical contact with the mesa top.

A metallized contact layer 36 is also deposited on the substrate side of the structure, using, for example, Ge:AuGe:Ni:Au. Wells, such as the one shown at 40, are etched from the substrate side of the structure, all the way through the substrate 10, and the buffer layer 12. The structure can then be mounted on a copper heat sink, indicated at 41, with the mesa 30 in direct contact with the sink. A dielectric stack reflector (DSR) 42 is formed in each of the wells 40. Each DSR 42 consists of twelve quarter-wavelength layers, i.e. six periods, of alternating silicon dioxide ($SiO_2$) and zirconium dioxide ($ZrO_2$). The reflectivity of the DSR 42 is approximately 95%, as determined by measurement.

The VCSE laser structure of the invention has two principal physical attributes that result in higher power and efficiency levels than have previously been attainable in other structures of the same type. First, the structure is mounted with active layer 18, or p-n junction "down", that is to say with the active layer placed in close proximity to the heat sink. Other lasers of this type have placed the active layer "up", meaning that it is further from the heat sink, and separated from it by a relatively thick supporting structure, including a substrate. In the present invention, the active layer 18 is positioned in close proximity to the heat sink, such that the active layer is positioned between the substrate and the heat sink. Because the active region is directly heat-sinked, the device of the invention is capable of operating in CW mode and at higher powers than were previously attainable. Second, because the high-reflectivity mirror 22 is placed behind the active layer 18, most of the light can be emitted through the lower-reflectivity mirror 42. As a result, the differential quantum efficiency is high.

Another aspect of the invention that contributes to its high power and efficiency is the action of the current confinement layer 32. The SSR 22 is heavily doped with magnesium and presents a low impedance to the flow of current, but the surrounding regrown n type layer 32 provides a back-biased p-n junction that tends to confine current flow to the mesa region.

The lasing characteristics of the diode structure of the invention were evaluated at room temperature and using pulsed-current conditions. At a pulse width of 200 ns and a cycle rate of 1 kHz, the diode achieves a maximum power output of 120 mW, as indicated in FIG. 3. the quantum efficiency was measured at 15% (0.21 mW/mA). These are significant improvements over previously published results of maximum powers of 10 mW and quantum efficiencies of 3-4% for devices of similar emitting area diameters.

Below its threshold current, the device of the present invention operates as a light-emitting diode (LED) with a diameter between 40 and 45 $\mu$m. At threshold, the device lases in a small filament of about 5 $\mu$m diameter. As the current is increased above threshold, additional filaments reach threshold until a 33-$\mu$m diameter region lases under the SSR 22.

In summary, the VCSE diode laser of the invention operates at output powers an order of magnitude better than the prior art. A high-reflectivity AlGaAs conducting SSR 22 provides current injection in a narrowly defined region, and also fulfills the function of a highly reflective rear mirror for the cavity. Finally, the current confinement layer achieves current confinement in the region of the rear reflector, without the need for dielectric or semi-insulating current confinement layers.

It will be appreciated from the foregoing that the present invention represents a significant advance in the field of vertical-cavity surface-emitting diode lasers. In particular, the invention provides a structure of this type capable of operating at more than ten times the power of other structures of the same type, and at higher quantum efficiencies. It will also be appreciated that, although an embodiment of the invention has been described in detail for purposes of illustration, various modifications may be made without departing from the spirit and scope of the invention. Accordingly, the invention is not to be limited except as by the appended claims.

We claim:

1. A vertical-cavity surface-emitting diode laser providing high output power at a high quantum efficiency, the laser comprising:
   a semiconductor supporting structure, including a substrate;
   a combination of generally planar semiconductor layers formed on one side of the substrate and including an active layer in which lasing takes place, and a pair of cladding layers positioned one on each side of the active layer;
   a first stack reflector formed on the combination of active and cladding layers and providing a highly reflective first mirror for a vertical cavity within the laser;
   a second stack reflector formed in a well recessed into the other side of the substrate, and having a reflectivity less than that of the first stack reflector, to provide a second mirror for the vertical cavity of the laser, through which light is emitted; and
   a pair of electrical contact layers, one on the first stack reflector and the other on the other side of the substrate, to inject current into the laser cavity;
   wherein the diode laser is mountable on a heat sink with the active layer positioned between the semiconductor supporting structure and the heat sink.

2. A vertical-cavity surface-emitting diode laser as defined in claim 1, wherein:
   the first stack reflector has a relatively small area, defining a relatively narrow cross-sectional area of the vertical cavity; and
   the laser further comprises a current confinement layer laterally surrounding the first stack reflector and extending into one of the cladding layers.

3. A vertical-cavity surface-emitting diode laser as defined in claim 2, wherein:
   the first stack reflector is a semiconductor stack reflector; and
   the second stack reflector is a dielectric stack reflector.

4. A vertical-cavity surface-emitting diode laser as defined in claim 1, wherein:
   the active layer is of gallium arsenide;
   the cladding layers are of aluminum gallium arsenide; and
   the substrate is of gallium arsenide.

5. A vertical-cavity surface-emitting diode laser as defined in claim 1, wherein:
   the first stack reflector is a semiconductor stack reflector having alternating layers of doped aluminum gallium arsenide ($Al_xGa_{1-x}As$) of different thicknesses and different proportions of aluminum defined by the factor x.

6. A vertical-cavity surface-emitting diode laser as defined in claim 5, wherein:

their are twenty-five pairs of layers in the semiconductor stack reflector; and the first layer of each pair has an x value of 0.1 and a thickness of approximately 620Å; and the second layer of each pair has an x value of 0.7 and a thickness of approximately 700Å.

7. A vertical-cavity surface-emitting diode laser as defined in claim 1, wherein:

the combination of semiconductor layers further includes a buffer layer adjacent to the substrate, and an etch stop layer formed between the buffer layer and the active and cladding layers, wherein the etch stop layer facilitates formation of the second stack reflector.

8. A vertical-cavity surface-emitting diode laser providing high output power at a high quantum efficiency, the laser comprising:

a semiconductor supporting structure, including a substrate of n type gallium arsenide;

a combination of generally planar semiconductor layers formed on the semiconductor supporting structure and including an active layer of gallium arsenide, in which lasing takes place, and a pair of cladding layers of n type and p type aluminum gallium arsenide, surrounding the active layer;

a semiconductor stack reflector formed on the combination of active and cladding layers and providing a highly reflective first mirror for a vertical cavity within the laser, the semiconductor stack reflector being formed from alternating layers of p type aluminum gallium arsenide of different thicknesses and aluminum proportions, the alternating layers being etched away except in a mesa region that limits the cross-sectional area of the vertical cavity;

a semiconductor current confinement layer formed to laterally surround the mesa, and to form a back-biased junction with the adjacent p type cladding layer, thereby confining current to the semiconductor stack reflector;

a dielectric stack reflector formed in a well recessed into the substrate, and having a reflectivity less than that of the first stack reflector, to provide a second mirror for the vertical cavity of the laser, through which light is emitted, the dielectric stack reflector having alternating layers of silicon dioxide and zirconium dioxide, each of thickness approximately equal to one quarter of the wavelength of the laser; and a pair of electrical contact layers, one on the semiconductor stack reflector and the other on the substrate, to inject current into the laser cavity;

wherein the diode laser is mountable on a heat sink, with the active layer positioned between the semiconductor supporting structure and the heat sink.

9. A method for the fabrication of a verticalcavity surface-emitting diode laser providing high output power at a high quantum efficiency, the method comprising the steps of;

forming a semiconductor supporting structure, including a substrate;

forming a combination of generally planar semiconductor layers on the semiconductor supporting structure, including an active layer in which lasing takes place, and a pair of cladding layers surrounding the active layer;

forming a first stack reflector on the combination of active and cladding layers, to provide a highly reflective first mirror for a vertical cavity within the laser;

forming a second stack reflector in a well recessed into the substrate, the second stack reflector having a reflectivity less than that of the first stack reflector, to provide a second mirror for the vertical cavity of the laser, through which light is emitted;

forming a pair of electrical contact layers, one on the first stack reflector and the other on the substrate, to inject current into the laser cavity; and mounting the diode laser on a heat sink, with the active layer positioned between the semiconductor supporting structure and the heat sink.

10. Method as defined in claim 9, and further including, after the step of forming the first stack reflector, the additional steps of:

removing the first stack reflector layer except in a mesa region defining the reflector; and growing a current confinement layer in a region laterally surrounding the mesa region, to form a back-biased junction with one of the cladding layers, thereby confining current substantially to the mesa region.

11. A method as defined in claim 10, and further comprising the steps of:

forming a buffer layer on the substrate prior to the formation of the cladding and active layers;

forming an etch stop layer on the buffer layer; and, before formation of the second stack reflector, or, etching a well in the substrate, whereby the etch stop layer facilitates formation of a flat-bottom well without damage to the cladding or active layers.

* * * * *

UNITED STATES PATENT AND TRADEMARK OFFICE
CERTIFICATE OF CORRECTION

PATENT NO. : 5,038,356
DATED : August 06, 1991
INVENTOR(S) : Dan Botez, Luke J. Mawst, Thomas J. Roth, Lawrence M. Zinkiewicz It is certified that error appears in the above-identified patent and that said Letters Patent is hereby corrected as shown below:

Insert the following paragraph before the Background:

> This invention was made with Government support under Contract No. F29601-87-C-0033 awarded by the Department of the Air Force. The Government has certain rights in this invention.

Signed and Sealed this

Twenty-fourth Day of November, 1992

Attest:

DOUGLAS B. COMER

*Attesting Officer*    *Acting Commissioner of Patents and Trademarks*